United States Patent [19]

Beck

[11] 4,239,788
[45] Dec. 16, 1980

[54] METHOD FOR THE PRODUCTION OF SEMICONDUCTOR DEVICES USING ELECTRON BEAM DELINEATION

[75] Inventor: William A. Beck, Ellicott City, Md.

[73] Assignee: Martin Marietta Corporation, Bethesda, Md.

[21] Appl. No.: 49,003

[22] Filed: Jun. 15, 1979

[51] Int. Cl.³ .............................................. B05D 3/06
[52] U.S. Cl. .................................. 427/43.1; 346/158; 346/161; 427/249; 427/250; 430/296; 430/298; 430/315
[58] Field of Search ............... 427/35, 43.1, 249, 250; 346/158, 159, 160, 161; 430/296, 298, 315

[56] References Cited

U.S. PATENT DOCUMENTS

| | | | |
|---|---|---|---|
| 3,333,984 | 8/1967 | Kaspaul et al. | 427/39 |
| 3,462,762 | 8/1969 | Kaspaul et al. | 346/158 |
| 3,485,657 | 12/1969 | Beaudry | 427/249 |
| 3,660,087 | 5/1972 | Kaspaul et al. | 346/159 |
| 3,809,635 | 5/1974 | Gillot et al. | 427/249 |
| 3,944,686 | 3/1976 | Froberg | 427/249 |
| 4,053,350 | 10/1977 | Olsen et al. | 427/249 |
| 4,086,108 | 4/1978 | Gonda | 148/175 |

*Primary Examiner*—John H. Newsome
*Attorney, Agent, or Firm*—Ronald G. Ort; Gary Chin

[57] ABSTRACT

A process for forming a delineated vapor deposition film of a deposition material on a substrate. The delineation is accomplished by exposing selected areas of the substrate to an electron beam before depositing the deposition material whereby the sticking coefficients of the selected areas are sufficiently reduced so as to prevent any significant deposition in those areas. Furthermore, irradiated areas of the substrate can be restored to their original surface characteristics by exposure to a second electron beam while the substrate is at an elevated temperature. Thus, areas of the substrate can be negatively delineated to prevent deposition, and such negatively delineated surfaces can then be positively delineated to permit deposition.

9 Claims, No Drawings

METHOD FOR THE PRODUCTION OF SEMICONDUCTOR DEVICES USING ELECTRON BEAM DELINEATION

BACKGROUND OF THE INVENTION

This invention relates to a method for producing semiconductor devices, and more particularly to a method for altering the surface characteristics of a substrate surface to inhibit or promote epitaxial growth by a second material on the surface.

In the formation of semiconductor devices by epitaxial growth techniques, a crystalline deposition material is caused to grow epitaxially on the surface of a crystalline substrate material. It is generally desirable to be able to form as precisely delineated a pattern of the deposition material or the surface as possible to permit maximum miniaturization of the semiconductor circuitry.

One technique which has been used to form expitaxially grown patterns has been first covering the substrate with a masking material, cutting the desired pattern through the masking material, depositing the deposition material by several possible methods, such as vapor deposition, and finally removing the masking material to leave the desired deposition pattern on the sruface. For example, in Olsen et al, U.S. Pat. No. 4,053,350, carbon masking material is used to define deposition regions on a substrate, using a first masking system to prevent deposition of the carbon in those areas in which crystal growth will be desired. The masking material must be a material upon which the deposition material will not grow, and must also be capable of being removed after the deposition process. The precision with which the deposited pattern can be delineated is limited, among other things, by the thickness of the masking material and the ability to completely remove the masking material first during the patterning step, and then in the removal step after deposition. A further problem with these masking techniques is that the removal of the masking material often results in the contamination of the surface of the deposited material, and even a very small amount of contamination of this surface can adversely affect the semiconductor device being produced.

Electron beams have been used in conjunction with various techniques to assist in forming precise patterns. In one technique the electron beam is used to induce a chemical reaction in selected areas of an organic film which is applied either directly to a substrate or to a previously applied coating on the substrate. The organic film can then act as a mask for formation of a deposition pattern by removing either the irradiated or un-irradiated areas with a specific solvent. In Gonda, U.S. Pat. No. 4,086,108, an electron beam is used in conjunction with a molecular beam in an MBE growth process. Gonda relates to a method of using an electron beam to control the doping of an MBE grown film which is uniformly deposited on the substrate.

SUMMARY OF THE INVENTION

In accordance with the present invention an electron beam is used to delineate a precisely defined epitaxial grown deposition pattern on a crystalline substrate. The present invention stems from the discovery that the sticking coefficient of a substrate can be altered by exposure of that substrate to an electron beam. The electron beam is believed to initiate a reaction which causes a monomolecular layer of carbon or hydrocarbon to form on the irradiated surface. Thereafter, a conventional deposition technique, such as vapor phase deposition or molecular beam epitaxy can be used to deposit a material on the substrate. The deposition material will only stick to the areas which were not irradiated, with little or no deposition material sticking to the irradiated areas. By a further process, previously irradiated areas can have their original high sticking coefficients restored by a second electron beam bombardment while the substrate is at an elevated temperature.

In a preferred embodiment of the present invention, an electron beam is used to delineate a pattern for the deposition of a film of lead-tin telluride ($Pb_{1-x}Sn_xTe$) on a $BaF_2$ substrate. The electron beam traces a pattern on the $BaF_2$ surface in ultra-high vacuum, after which the surface is exposed to lead-tin telluride vapor. Little or no lead-tin telluride deposits on the $BaF_2$ surface areas which have been irradiated, while normal deposition occurs in the areas which were not irradiated. Furthermore, the areas of the $BaF_2$ substrate on which epitaxial growth was inhibited by the electron beam as described above can thereafter be restored to their original condition by a second electron beam applied to the substrate. Then, when the surface is exposed to the deposition vapor, growth will not occur in those areas which were exposed to the first beam and not exposed to the second beam, while the deposition material will deposit on the remainder of the substrate. For purposes of distinguishing between the first and second type of electron beam processes, the first process in which preselected areas of the substrate have their sticking coefficients lowered will be hereinafter referred to as "negative delineation". The second process in which previously irradiated areas have their high sticking coefficients restored by a second electron beam will be referred to as "positive delineation".

The surface of the epitaxially grown layer formed in accordance with the present invention can be kept almost totally free of contamination, thus producing an ultra-clean interface for deposition of further materials. This is because this entire process can be done in a single vacuum chamber further minimizing the exposure of the surface to contaminants. Furthermore, the thin carbon coating masking layer which is deposited in accordance with the present invention is on the order of a monolayer in thickness, and has been found to be electrically insignificant. Therefore, it is not necessary to remoe this carbon mask because it generally has no effect on the semiconductor performance. This is in contrast to prior masking techniques in which the mask had to be removed before the semiconductor device could be completed. The removal of such masks could result in contamination of the exposed surfaces with solvent or masking material.

It is therefore a principal object of this invention to provide a technique for the delineation of a deposition pattern on a substrate using an electron beam to lower the sticking coefficient of the substrate.

It is a further object to provide a technique for restoring the high sticking coefficient of a previously irradiated substrate using a second electron beam.

A further object is to provide a technique for forming an epitaxially grown film which is almost completely free of surface contamination to provide an ultra-clean interface with a later deposited material.

These and other objects and advantages of the present invention will be apparent from the following detailed discussion of the preferred embodiments of this invention.

DESCRIPTION OF THE PREFERRED EMBODIMENTS

The process of the present invention stems from the discovery that under the proper conditions, irradiation by an electron beam of a substrate surface can inhibit the growth of a deposition material on that surface. Therefore, to be suitable for use with this process, the deposition material and substrate material must have crystalline structures which will normally permit the epitaxial growth of the deposition material on the substrate. A further aspect of this invention is that a second electron beam, under different conditions from the first, can then be used to neutralize the effect of the first beam, such that the prior ability of the substrate to act as a site for epitaxial growth of the deposition material is restored.

A preferred substrate material for use in the process of this invention is a cleaved surface of crystalline barium fluoride ($BaF_2$), although it is believed that other barium halides would also be suitable. This proces may also be useful with other group II halides as substrates, but such materials are not generally used for this purpose in semiconductor devices.

The deposition material must be one that is capable of epitaxial crystal growth on the surface of the substrate. In general, the preferred deposition materials are chalcogenides comprising one or more group IV elements in combination with one or more group VI elements, hereinafter simply referred to as group IV-VI materials. Of these, the preferred deposition material for use with a $BaF_2$ substrate in the present invention is a lead-tin telluride of the general formula $Pb_{1-x}Sn_xTe$, or, expressed differently, (Pb,Sn)Te. Other lead chalcogenides, such as lead telluride (PbTe) are also suitable for use in the present invention, and have been successfully grown on $BaF_2$ substrates using the process of the present invention.

Before discussing the electron beam delineation processs of the present invention, it is necessary to briefly describe the preferred molecular beam epitaxy (MBE) vapor phase deposition technique with which this delineation process is used. In the MBE process a heated specimen of substrate material is exposed, under vacuum to a beam of deposition material molecules. This beam may be generated in a number of ways, with the preferred method of this invention being simply to heat the deposition materials in a crucible to generate deposition material vapor. This is done in a closed chamber which is only open to the vacuum chamber containing the substrate through a shuttered portal of predetermined dimensions. Thus a beam of deposition material vapor will pass through the portal only when the shutter is open, and can be aimed to impinge the surface of the substrate mounted in the vacuum chamber and facing the portal opening. When a substrate is exposed to the deposition material by this well-known process, a uniform film of the deposition material can be grown epitaxially on the surface of the substrate.

In the negative delineation process of the present invention a cleaned section of substrate material is placed in a vacuum chamber, which is then pumped out to a high vacuum of generally at least $10^{-8}$ Torr. Areas of the substrate on which it is not desired to deposit the deposition material are then exposed to an electron beam. The substrate is then heated to the proper temperature for the molecular beam epitaxy deposition, and the MBE process proceeds as usual. Those areas of the substrate which have been exposed to an appropriate electron beam will not permit epitaxial growth of the deposition material, and will remain substantially free of that material. This was verified by actual tests which showed that less than monolayer of deposition material had deposited on the irradiated areas. Those areas which were not exposed will have a normal amount of epitaxial growth of the deposition material. Thus deposition-free areas can be delineated on the surface of the substrate.

The manner in which the electron beam alters the surface of the substrate to inhibit deposition is not completely understood, but seems to be as follows for a $BaF_2$ substrate. Auger electron spectroscopy (AES) was used to analyse the chemical content of the substrate surfaces discussed hereinafter. AES is a well-known analysis technique in which an electron beam is projected on the test surface, and the resultant spectrum shows the elemental content of that surface. Because AES uses an electron beam of an energy comparable to that of the present invention, freshly cleaved $BaF_2$ analysed by this technique has been found to have a rapidly decreasing amount of surface fluorine. Also, when analysed by low energy electron diffraction (LEED) techniques, the surface is found to be quite uniformly ordered. This surface acts as a suitable site for epitaxial growth of the deposition material, and can thus be said to have a high sticking coefficient.

When such a substrate is exposed to an electron beam with an energy greater than about 10 eV and preferably between about 0.1 and 2 keV under a high vacuum, a pressure of less than $10^{-8}$ Torr and preferably about $10^{-9}$ Torr being suitable, then significant changes occur in the surface. Analysis by AES has shown that the fluorine content of the irradiated surface decreases and the oxide content increases. This is believed to be the result of residual oxygen on the surface of the substrate or in the vacuum system reacting at the surface to form barium oxide. Furthermore, LEED analysis indicates that the surface is now disordered, and that the disorder does not anneal when the sample is heated to 450° C., which is above the normal deposition temperature for lead-tin telluride on barium fluoride. It may therefore be concluded that electron beam irradiation at room temperature and in a high vacuum produces a disordered barium oxide surface on the $BaF_2$.

One additional comment should be made now about the AES spectrum analysis technique. Although this technique can very accurately distinguish among fluorine, oxygen, and carbon on the substrate surface, it is unable to indicate the presence or absence of hydrogen. Therefore, when the test indicates an oxide coating, the coating may in fact be hydroxide, and likewise a carbon coating might be a hydrocarbon coating. However, for purposes of explaining the action of this process, it is not believed that the presence or absence of hydrogen will alter the concept of this invention.

When the sample is then heated to 450° C. for one hour, a carbon AES signal appears on the irradiated areas, indicating formation of a carbon or hydrocarbon layer of the order of one monolayer in thickness. When deposition is attempted on these irradiated areas, AES analysis indicates that little or no lead-tin telluride deposition material sticks to these areas, as opposed to the un-irradiated areas on which epitaxial growth occurs. These tests tend to show that the low sticking coefficient of the irradiated areas is due to the carbon layer which forms on those areas. It is believed that the carbon layer is formed by the reaction of the barium oxide layer with a residual gas in the vacuum system. Mass spectrometer residual gas analysis has shown that CO, $CO_2$ and $CH_4$ are the major carbon compound residuals, and hence the most likely participants.

In the positive delineation process of the present invention, the high sticking coefficient of the original substrate is restored to an area which has been previously irradiated by the above process. This is accomplished by exposing the previously irradiated surface to a second electron beam after the substrate has been heated to an elevated temperature, about 450° C. being used in the present case. The electron beam used for this purpose can be of about the same energy level as the first electron beam with energies of 0.1 to 2 KeV being preferred and a 2 keV beam giving particularly excellent results. The restoration of the high sticking coefficient is believed to be due to the removal of the carbon layer by the action of the second electron beam. Analysis by AES indicates that when areas previously coated with carbon are exposed to this second electron beam, they are restored to their original $BaF_2$ content. It is believed that the electron beam removes the carbon, and that at this elevated temperature fluorine from below the surface readily diffuses to the surface to form $BaF_2$. Apparently, at the higher temperature, the barium-fluoride reaction is kinetically dominant over the barium-oxide reaction, while at room temperatures the barium-oxide reaction dominates. Analysis by LEED also indicates that the twice irradiated surfaces have also been restored to their previously well-ordered structure.

It is generally believed that a higher surface disorder, as measured by LEED, results in a higher sticking coefficient on that surface for vapor deposition growth. Therefore, it would be expected that irradiation which causes disordering of a surface would increase the ability of that surface to act as a nucleating site for epitaxial growth. Yet, surprisingly these tests reveal that the more highly disorded surface of the irradiated areas of the present invention have a lower sticking coefficient. This is believed to be because of the presence on the surface of the carbon layer which seems to override the effect of the increased surface disorder. Thus, the present invention shows the surprising result of a disordered surface having a lower sticking coefficient than an ordered surface.

EXAMPLE I

As examples of the present invention, films of lead-tin telluride (Pb, Sn)Te Te in the ratio of approximately $Pb_{0.8}Sn_{0.2}Te$ were deposited on $BaF_2$ substrates. The substrates were prepared by cleaving $BaF_2$ in air along the (1,1,1) plane. The (Pb, Sn)Te was deposited by a molecular beam epitaxy technique, in which the molecular beam was generated by heating a homogeneous mixture of PbTe and SnTe, in the appropriate ratio to generate $Pb_{0.8}Sn_{0.2}Te$, to approximately 580° C. in a boron nitride crucible. This produced a deposition rate on the substrate of about 1 to 2 micrometers per hour.

The process of this example without the use of an electron beam proceeded as follows. The $BaF_2$ was cleaved, and then immediately placed in a vacuum chamber which pumped down to less than $2 \times 10^{-9}$ Torr. The $BaF_2$ substrate was then heated to about 450° C., during which the vacuum tended to rise to about $1 \times 10^{-8}$ Torr, and then to return to about $3 \times 10^{-9}$ Torr. After an hour at 450° C., the substrate temperature was lowered to about 395° C. and the deposition of the (Pb, Sn)Te was commenced. This procedure generally resulted in the formation of a uniform specular film of the (Pb, Sn)Te on the substrate surface. The deposition temperature of about 395° C. was selected because it was found that the (Pb, Sn)Te tends to re-evaporate from the substrate when the surface temperature is above about 400° C. Because the resultant film quality tends to be best when the deposition is performed at the highest possible temperature, 395° C. was chosen for an optimum deposition rate with a minimum of re-evaporation, although any temperature between about 375° C. and about 400° C. will give satisfactory results, with 390° C. to 395° C. being preferred.

In carrying out the negative delineation process of the present invention, the $BaF_2$ was cleaved and put under vacuum as described above. Before heating the $BaF_2$ substrate, selected areas of the substrate were exposed to an electron beam. Good results were obtained using beam energies of between about 0.2 to 2 keV, with 2 keV beams giving particularly good results. After exposure, the deposition process then proceeded exactly as described above. Examination of the substrate revealed that in those areas which had been exposed to the electron beam before heating, little or no growth of (Pb, Sn)Te had occured. This shows that the sticking coefficient of the substrate surface had been sufficiently reduced by exposure to the electron beam to prevent epitaxial growth from occuring.

EXAMPLE II

The purpose of this example is to demonstrate the positive delineation process of the present invention. The process generally followed the general process described in Example I, except as follows. After the $BaF_2$ was cleaved and placed in the vacuum chamber, an area of the substrate was exposed to an electron beam as described above for the negative delineation process of Example I. The $BaF_2$ substrate was then heated to about 450° C., and while at that temperature selected areas of the previously irradiated areas were exposed to a second electron beam with an energy of about 2 keV. The substrate temperature was then lowered to about 395° C. and deposition of the (Pb, Sn)Te was commenced. Examination of the substrate revealed that those areas of the substrate which had been exposed to both the first and second electron beams had normal growths of (Pb, Sn)Te, while those which had been exposed only to the first beam showed little or no (Pb, Sn)Te growth. Thus, the irradiation of the previously exposed areas at elevated temperature restored the substrate to its original condition, in which the surface had a high sticking coefficient and permitted (Pb, Sn)Te deposition. By using a combination of the positive and negative delineation processes of the present invention, complex deposition patterns can readily be formed on substrate surfaces.

The terms and expressions which have been employed are used as terms of description and not of limitation, and there is no intention in the use of such terms and expressions of excluding any equivalents of the features described or portion thereof, but it is recognized that various modifications are possible within the scope of the invention claimed.

What is claimed is:

1. A process for forming a delineated vapor deposition grown film of a deposition material on a substrate wherein the film is grown by exposing the substrate to the vapor of the deposition material comprising the steps of:

irradiating preselected areas of the substrate, in the presence of a carbon containing gas, with a first electron beam which is capable of altering the surface properties of said preselected areas, heating said substrate to a temperature at which carbon deposits on the irradiated areas, allowing carbon to deposit on said preselected areas, and then exposing the substrate to the vapor of the deposition material, whereby little or no deposition material will deposit on said preselected areas but will deposit on the areas of the substrate which were not exposed to the electron beam.

2. The process of claim 1 wherein the substrate consists essentially of a crystalline barium halide and the deposition material consists essentially of a group IV-VI material comprising a compound of one or more group IV elements in combination with one or more group VI elements.

3. The process of claim 2 wherein the substrate consists essentially of barium fluoride and the deposition material consists essentially of a lead-tin telluride of the general formula (Pb, Sn)Te.

4. The process of claim 2 wherein the substrate consists essentially of barium fluoride and the deposition material consists essentially of lead telluride.

5. The process of claim 1, 2, 3 or 4 wherein the energy level of the first electron beam is at least 100 eV.

6. The process of claim 1, 2, 3 or 4 further comprising the step of:

irradiating a portion of the preselected areas, which were irradiated by the first electron beam, with a second electron beam after the carbon has deposited on the preselected areas, for the purposes of removing the deposited carbon and increasing the sticking coefficients of these twice-irradiated portions of the substrate to a level sufficient to induce the deposition of the film.

7. The process of claim 5 wherein the energy level of the first electron beam is at least 100 eV and the energy level of the second electron beam is at least 500 eV.

8. An improved process for forming a delineated pattern of an epitaxially grown film of lead-tin telluride on a barium fluoride substrate wherein lead-tin telluride is deposited on the substrate by placing the substrate in a vacuum chamber, evacuating the chamber to high vacuum, heating the substrate to a pre-determined deposition temperature, and exposing the substrate to a beam of lead-tin telluride vapor, the improvement comprising:

lowering the sticking coefficient of preselected areas of the substrate by irradiating said preselected areas, in the presence of a residual carbon containing gas, with a first electron beam after the chamber has been evacuated but before the substrate has been heated to the deposition temperature, whereby the lead-tin telluride will be inhibited from growing on said preselected areas, and said preselected areas will have little or no lead-tin telluride on them after the deposition process is completed.

9. The process of claim 8 wherein the improvement further comprises:

irradiating a portion of said preselected areas, which were irradiated by the said first electron beam, while the substrate is at or near the deposition temperature, with a second electron beam to increase the sticking coefficients of these twice-irradiated portions of the substrate to a level sufficient to induce the deposition of the epitaxially grown film.

* * * * *